United States Patent [19]
Stein et al.

[11] Patent Number: 5,968,265
[45] Date of Patent: Oct. 19, 1999

[54] METHOD FOR PRODUCING SILICON CARBIDE MONOCRYSTALS

[75] Inventors: René Stein, Röttenbach; Roland Rupp, Lauf; Johannes Völkl, Erlangen, all of Germany

[73] Assignee: Siemens Aktiengesellschaft, Munich, Germany

[21] Appl. No.: 09/013,990

[22] Filed: Jan. 27, 1998

Related U.S. Application Data

[63] Continuation of application No. PCT/DE96/01299, Jul. 17, 1996.

[30] Foreign Application Priority Data

Jul. 27, 1995 [DE] Germany .......................... 195 27 536

[51] Int. Cl.$^6$ ..................................................... C30B 7/10
[52] U.S. Cl. ................................ 117/71; 117/68; 117/79; 117/952; 423/345
[58] Field of Search ................................. 117/68, 71, 79, 117/952; 423/345

[56] References Cited

U.S. PATENT DOCUMENTS

| | | |
|---|---|---|
| 4,753,787 | 6/1988 | Krijgsman . |
| 4,866,005 | 9/1989 | Davis et al. . |
| 4,983,374 | 1/1991 | Krijgsman ............................... 423/593 |
| 5,026,527 | 6/1991 | Krijgsman . |

FOREIGN PATENT DOCUMENTS

4033820A1  5/1991  Germany .

OTHER PUBLICATIONS

Roy et al, "Attempted Hydrothermal Synthesis of Diamond by Hydrolgsis of .beta SiC Powder", Diamond Related Materials vol. J(9), pp. 973–976, 1996.

Coragianis Broadbridge, "Low Temperature–High Pressure Oxidation of 3C–SiC", Mater. Res. Soc. Symp. Proc. (357) pp. 213–218, 1995.

Gogotsi et al., "Formation of Carbon Films on Carbides Under Hydrothermal Conditions" Nature 367 (6464) pp. 628–30, 1994.

"Die Rolle der Hydrothermalsynthese in der präparativen Chemie" (the role of the hydrothermal synthesis in the preparative chemistry), Albrecht Rabenau, Angew. Chemie 97, 1985, pp. 1017–1031.

"Diamond formed at low pressures and temperatures through liquid–phase hydrothermal synthesis", Szymanski et al., Diamonds and Related Materials 4, 1995, pp. 234–235.

Japanese Patent Abstract No. 57042600 (Takashi et al.), dated Mar. 10, 1982.

"Hydrothermal Growth of Quartz Crystals in KCl Solution", Hosaka et al., Journal of Crystal Growth 53, 1981, pp. 542–546.

*Primary Examiner*—Robert Kunemund
*Attorney, Agent, or Firm*—Herbert L. Lerner; Laurence A. Greenberg

[57] ABSTRACT

A method for producing cubic SiC monocrystals includes dissolving SiC powder or other starting material in a solvent at high overpressures and growing the monocrystals on a seed crystal.

13 Claims, No Drawings

METHOD FOR PRODUCING SILICON CARBIDE MONOCRYSTALS

CROSS-REFERENCE TO RELATED APPLICATION

This application is a continuation of International Application Ser. No. PCT/DE96/01299, filed Jul. 17, 1996, which designated the United States.

BACKGROUND OF THE INVENTION

Field of the Invention

The invention relates to a method for producing silicon carbide monocrystals.

Metal smelting processes, silicon melting processes, and cultivation processes through the gas phase are known for producing cubic silicon carbide monocrystals. The best results have been obtained thus far by cultivation using the sublimation process. In that process, silicon carbide (SiC) in solid form is sublimated and grown as a silicon carbide monocrystal through the gas phase on a seed crystal or seed crystal. However, in a sublimation process, temperatures of over 2000° C. as a rule have to be handled.

A method for growing SiC out of an aqueous solution at room temperature is knows from Japanese Patent JP 57042600. In that known method, however, the growth rates are extremely low.

A publication entitled: Journal of Crystal Growth, Vol. 53 (1981), p. 542, discloses a hydrothermal process for cultivating quartz crystals, in which quartz at temperatures between 350° C. and 500° C. is dissolved in a KCl or NaCl solution in a pressure-proof autoclave and crystallizes out of the solution on a seed.

A publication entitled: Diamond and Related Materials, Vol. 4 (1995), pp. 234–235 discloses a hydrothermal process for cultivating diamond crystals, in which a special aqueous solution is placed in a pressure-proof autoclave, and a polycrystalline diamond film is grown out of the solution on a diamond seed crystal, at a temperature of 400° C. and a pressure of 170 MPa.

A review of other known hydrothermal syntheses is provided in a publication entitled: Angewandte Chemie [Applied Chemistry], Vol. 97, 1985, pp. 1017–1032.

SUMMARY OF THE INVENTION

It is accordingly an object of the invention to provide a method for producing silicon carbide monocrystals, which overcomes the hereinafore-mentioned disadvantages of the heretofore-known methods of this general type.

With the foregoing find other objects in view there is provided, in accordance with the invention, a method for producing silicon carbide monocrystals, which comprises introducing a solvent starting material in solid form and at least one seed crystal into a pressure-proof vessel; establishing a pressure in the vessel above $10^5$ Pa (1 bar equals approximately standard pressure) and so great as to at least partially dissolve the at least one starting material in the solvent; selecting the solvent and the starting material to form a solution of the starting material and the solvent containing both silicon and carbon; and growing a silicon carbide monocrystal out of the solution on the at least one seed crystal.

The invention is based on the concept of creating a solution that contains silicon and carbon by dissolving a solid starting substance in a solvent at a sufficient overpressure, and out of this solution growing a silicon carbide monocrystal on a seed crystal.

In accordance with another mode of the invention, a solid starting material is used that contains only one of the two elements silicon and carbon, or that contains both of them.

In accordance with a further mode of the invention, silicon carbide is used as the solid starting material.

In accordance with an added mode of the invention, the solvent also contains at least one of the two elements silicon and carbon.

In accordance with an additional mode of the invention, the solvent contains water ($H_2O$).

In accordance with yet another mode of the invention, electrolytes (ions) are added to the water to increase or decrease the pH, in order to improve the solubility of the starting material in the water.

In accordance with yet a further mode of the invention, the solvent contains a hydrocarbon compound.

In accordance with yet an added mode of the invention, at least one dopant is introduced into the pressure-proof vessel for doping the growing silicon carbide monocrystal.

In accordance with yet an additional mode of the invention, the overpressure in the vessel is adjusted by adding heat. The pressure in the vessel is dependent on the heat flow supplied and on the degree to which the solvent fills the vessel.

In accordance with again another mode of the invention, the pressure in the vessel is approximately $10^7$ Pa (100 bar).

In accordance with again a further mode of the invention, the solid starting material is kept at a higher temperature than the at least one seed crystal. As a result, a temperature gradient is established between the solid starting material (stock) and the seed crystal. Since the solubility of the starting material is temperature-dependent, the result of the temperature gradient is a concentration gradient of the dissolved starting material in the solution between the stock and the seed crystal. The transport rate (diffusion rate) of the starting material from the stock to the seed crystal can therefore be adjusted through the temperature gradient.

Through the use of an additional screen device, such as a grating, in the vessel, the influence of convection in the vessel can be reduced and at the same time the diffusion rate between the stock and the seed crystal can additionally be adjusted.

In accordance with a concomitant mode of the invention, dissolved oxygen in the solvent is at least largely removed. As a result, oxidation of the silicon and of the carbon in the solution can be avoided.

Other features which are considered as characteristic for the invention are set forth in the appended claims.

Although the invention is described herein as embodied in a method for producing silicon carbide monocrystals, it is nevertheless not intended to be limited to the details discussed, since various modifications and structural changes may be made therein without departing from the spirit of the invention and within the scope and range of equivalents of the claims.

The construction and method of operation of the invention, however, together with additional objects and advantages thereof will be best understood from the following description of specific examples of exemplary embodiments.

DESCRIPTION OF THE PREFERRED EMBODIMENTS

Referring now to the embodiments of the invention in detail, initially a vessel (autoclave) which withstands pressures used in the method is furnished, with an example thereof being a steel vessel having a suitably selected wall thickness. The vessel may in particular be lined with TEFLON.

A starting material (stock material) in the solid aggregate state is introduced preferably into a lower portion of this pressure-proof container (vessel). The starting material includes one or more substances that contain at least one of the two elements, silicon (Si) or carbon (C), in elemental form or in the form of compounds. Examples of carbon-containing starting material are solid hydrocarbon compounds, such as paraffins or sugar, or carbon in elemental form. Examples of silicon-containing starting material are elemental silicon, silicates, preferably sodium silicate ($NaSiO_4$), or silicon dioxide. Examples of starting materials that contain both silicon and carbon are silicon carbide (SiC), especially in the form of sintered material, or some other substance containing both silicon and carbon, or a mixture of a carbon-containing substance and a silicon-containing substance. Due to the greater surface area and the attendant higher dissolution speed, the starting material is preferably selected to be in powdered form.

At least one seed crystal, preferably a silicon carbide monocrystal of a predetermined polytype, is disposed preferably in an upper portion of the vessel.

The vessel is also at least partly filled with a solvent that is generally liquid under standard conditions (standard pressure, room temperature).

The preferred solvent is water ($H_2O$) or a mixture that contains water. Distilled water is preferably used. In another embodiment, ions (electrolytes) are added to the water to vary its pH. Adding lyes,, such as NaOH, KOH, $NH_4OH$ or $Mg(OH)_2$, makes the water alkaline (higher pH), while adding acids, such as HF, HCl, $H_2SO_4$ or $HNO_3$ or a combination of these acids, especially the combination of HF, $H_2SO_4$ and $HNO_3$, conversely makes it acidic (lower pH). The solubility of the starting material in the water can be increased thereby.

A further suitable solvent is ammonia ($NH_3$) in aqueous solution.

In a particular embodiment, the solvent itself contains carbon and/or silicon and can then itself be a source of carbon or silicon for the crystal growth. Hydrocarbon compounds such as alcohols, for instance methanol or ethanol, formic acid or liquid alkanes, such as hexane, that are liquid under normal conditions, that is at normal pressure and room temperature, can be used as examples of carbon-containing solvents. After the starting material and the solvent is placed in the vessel, an overpressure is generated, that is a pressure above 1 bar (equals $10^5$ Pa), in order to increase the solubility of the starting material in the solvent. The pressure is preferably generated by adding heat to the vessel, but it can also be generated mechanically by compressing the solvent.

If the pressure is generated thermally, the solvent is brought to a predetermined temperature in the vessel. This temperature is selected in such a way that a predetermined pressure in the vessel is established as a function of the degree to which the solvent fills the vessel. This exploits the fact that the pressure, as a function of the temperature, when the volume of the container remains the same (isochores), has a different characteristic for different solvent filling levels. The higher the fill level of the solvent, especially water, in the vessel, the more markedly the pressure rises as the temperature increases. The temperatures in the vessel are generally established as being above 100° C. and below about 1200° C. and preferably between about 150° C. and about 500° C. The pressure in the vessel is adjusted by adaptation of the fill level of the solvent in the vessel to generally above 1 bar ($10^5$ Pa) and preferably above 100 bar ($10^7$ Pa) and will generally not substantially exceed 10 kbar ($10^9$ Pa).

In a first variant for thermal generation of the pressure, the pressure-proof vessel is placed in an oven. Conversely, in a second variant the vessel is assigned its own heater, which may, for example, be integrated in the form of resistance heating into the container wall.

The at least one starting material, in the solvent which is then at an overpressure, enters substantially more markedly into physical and/or chemical solution than at normal pressure. The dissolved starting mate rial, by out-crystallization and optionally including a chemical reaction, then grows in the form of a cubic SiC crystal on the at least one seed crystal.

In order to dope the growing silicon carbide monocrystal, a desired dopant can be added to the solution, with an example being boron or aluminum for p-doping and nitrogen for n-doping. The dopant may be a solid, liquid or gaseous substance. Ammonia, nitrogen gas or an amine compound are suitable in the case of nitrogen doping. At the same time, ammonia can be one ingredient of the solvent, or the sole ingredient thereof. Aluminum and boron can be supplied particularly in elemental form.

In an especially advantageous embodiment, the vessel is heated in such a way that in its lower portion having the stock material, a higher temperature prevails than in the upper portion having the at least one seed crystal. As a result, a temperature gradient is established between the stock (solid starting material) and the seed crystal. Due to the resultant concentration gradient of the starting material, dissolved in the water, between the stock and the seed and the attendant diffusion, the transport rate of the starting material from the stock to the seed crystal can be influenced through the use of this provision.

Aside from the establishment of the temperature gradient, the transport rate from the stock to the seed can also be controlled by incorporating an additional transport regulator into the autoclave, such as a screen device like a grating (sieve), and/or an agitator. Through the use of a screen device, in particular, it is also possible to reduce the undesired influence of convection in the container.

A higher transport rate leads to a greater growth rate of the silicon carbide monocrystal on the seed crystal.

In order to avoid oxidation of silicon and oxygen found in the solution, the oxygen which is physically dissolved in the solvent can be removed from the solvent before the cultivation of the silicon carbide monocrystal or even before the solvent is introduced. This can be done, for instance, by boiling it out, by gas exchange with an inert gas, by reducing the pressure in the vessel, by adsorption, or by distillation in a protective gas such as argon.

In another embodiment, flow baffles are provided which conduct a flow, created in particular by upward convection, to the at least one seed crystal.

In order to perform the method according to the invention, it is also possible in principle to use the devices and autoclaves known from the reference mentioned at the outset, entitled: Angewandte Chemie [Applied Chemistry], Vol. 97, 1985, pp. 1017–1032.

We claim:

1. A method for producing silicon carbide monocrystals, which comprises:

a) introducing a solvent starting material in solid form and at least one seed crystal into a pressure-proof vessel;

b) establishing a pressure in the vessel above $10^5$ Pa and great enough to at least partially dissolve the at least one starting material in the solvent;

c) selecting the solvent and the starting material to form a solution of the starting material and the solvent containing both silicon and carbon; and d) growing a silicon carbide monocrystal out of the solution on the at least one seed crystal.

2. The method according to claim 1, which comprises selecting a material containing only one element from the group consisting of silicon and carbon as the solid starting material.

3. The method according to claim 1, which comprises selecting a material containing both silicon and carbon as the solid starting material.

4. The method according to claim 3, which comprises selecting silicon carbide as the solid starting material.

5. The method according to claim 1, which comprises selecting a solvent containing at least one of the elements silicon and carbon as the solvent.

6. The method according to claim 1, which comprises selecting a solvent containing water as the solvent.

7. The method according to claim 6, which comprises varying the pH of the water by adding electrolytes.

8. The method according to claim 1, which comprises selecting a solvent containing a hydrocarbon compound as the solvent.

9. The method according to claim 1, which comprises introducing at least one dopant into the pressure-proof vessel for doping the growing silicon carbide monocrystal.

10. The method according to claim 1, which comprises adjusting the pressure in the vessel by adding heat.

11. The method according to claim 1, which comprises establishing a pressure of at least approximately $10^7$ Pa in the vessel.

12. The method according to claim 1, which comprises keeping the starting material at a higher temperature than the at least one seed crystal.

13. The method according to claim 1, which comprises at least largely removing oxygen physically dissolved in the solvent, from the solvent.

* * * * *